(12) United States Patent
Sugawara et al.

(10) Patent No.: US 12,039,130 B2
(45) Date of Patent: Jul. 16, 2024

(54) DISPLAY DEVICE INCLUDING SHIFT REGISTER CIRCUIT

(71) Applicant: Japan Display Inc., Tokyo (JP)

(72) Inventors: Mitsuhiro Sugawara, Tokyo (JP); Norio Mamba, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/070,670

(22) Filed: Nov. 29, 2022

(65) Prior Publication Data

US 2023/0168768 A1 Jun. 1, 2023

(30) Foreign Application Priority Data

Nov. 30, 2021 (JP) .................. 2021-194534

(51) Int. Cl.
| | |
|---|---|
| *G11C 19/28* | (2006.01) |
| *G06F 3/041* | (2006.01) |
| *G09G 3/20* | (2006.01) |
| *G06F 3/042* | (2006.01) |
| *G06F 3/044* | (2006.01) |

(52) U.S. Cl.
CPC ....... *G06F 3/04166* (2019.05); *G09G 3/2096* (2013.01); *G11C 19/28* (2013.01); *G06F 3/0412* (2013.01); *G06F 3/04184* (2019.05); *G06F 3/042* (2013.01); *G06F 3/0443* (2019.05); *G09G 3/20* (2013.01); *G09G 2310/0286* (2013.01); *G09G 2310/061* (2013.01)

(58) Field of Classification Search
CPC ............... G06F 3/04166; G06F 3/0412; G06F 3/04184; G06F 3/042; G06F 3/0443; G09G 3/2096; G09G 3/20; G09G 2310/0286; G09G 2310/061; G11C 19/28
See application file for complete search history.

(56) References Cited

U.S. PATENT DOCUMENTS

| | | | | |
|---|---|---|---|---|
| 2002/0074551 A1* | 6/2002 | Kimura | .................. | G06F 3/042 438/149 |
| 2005/0093851 A1* | 5/2005 | Nakamura | ........... | G09G 3/3677 345/204 |

(Continued)

FOREIGN PATENT DOCUMENTS

| | | | | |
|---|---|---|---|---|
| CN | 111028811 A | * | 4/2020 | ........... G06F 3/0416 |
| JP | 2017-049299 A | | 3/2017 | |

*Primary Examiner* — Adam J Snyder
(74) *Attorney, Agent, or Firm* — K&L Gates LLP

(57) ABSTRACT

A display device includes: pixels arranged in a display region; photodiodes provided in two or more of the pixels, respectively; a shift register circuit configured to sequentially output an output signal to the pixels and the photodiodes; a switching circuit configured to switch coupling between the shift register circuit and the pixels, and coupling between the shift register circuit and the photodiodes; and a control circuit configured to control a display period for display by the pixels and a detection period for detection by the photodiodes in a time division manner. The control circuit is configured to sequentially output a gate drive signal to the pixels by an operation of the shift register circuit and the switching circuit in the display period, and sequentially output a sensor control signal to the photodiodes by an operation of the shift register circuit and the switching circuit in the detection period.

6 Claims, 15 Drawing Sheets

(56) References Cited

U.S. PATENT DOCUMENTS

| | | | |
|---|---|---|---|
| 2005/0212916 A1* | 9/2005 | Nakamura | G06F 3/0412 348/207.99 |
| 2006/0146112 A1* | 7/2006 | Kim | G09G 3/3677 347/149 |
| 2007/0040792 A1* | 2/2007 | Kwag | G09G 3/3666 345/100 |
| 2022/0093032 A1* | 3/2022 | Lin | G09G 3/2092 |

* cited by examiner

DISPLAY DEVICE INCLUDING SHIFT REGISTER CIRCUIT

CROSS-REFERENCE TO RELATED APPLICATION

This application claims the benefit of priority from Japanese Patent Application No. 2021-194534 filed on Nov. 30, 2021, the entire contents of which are incorporated herein by reference.

BACKGROUND

1. Technical Field

What is disclosed herein relates to a display device.

2. Description of the Related Art

Display devices that include photosensors capable of detecting fingerprint patterns and vascular patterns are known (for example, Japanese Patent Application Laid-open Publication No. 2017-49299 (JP-A-2017-49299)). The display devices with the photosensors disclosed in JP-A-2017-49299 have a configuration in which the photosensors are embedded in particular pixels and gate lines for display also serve as wiring for the photosensors.

In the display device with the photosensors, a scanning line drive circuit for display that scans a plurality of pixels and a scanning line drive circuit for detection that scans a plurality of photosensors are provided separately from each other. This may make it difficult to provide a narrower frame.

For the foregoing reasons, there is a need for a display device with photosensors that can be provided with a narrower frame.

SUMMARY

According to an aspect, a display device includes: a plurality of pixels arranged in a display region; a plurality of photodiodes provided in two or more of the pixels, respectively; a shift register circuit configured to sequentially output an output signal to the pixels and the photodiodes; a switching circuit configured to switch coupling between the shift register circuit and the pixels, and coupling between the shift register circuit and the photodiodes; and a control circuit configured to control a display period for display by the pixels and a detection period for detection by the photodiodes in a time division manner. The control circuit is configured to sequentially output a gate drive signal to the pixels by an operation of the shift register circuit and the switching circuit in the display period, and sequentially output a sensor control signal to the photodiodes by an operation of the shift register circuit and the switching circuit in the detection period.

DETAILED DESCRIPTION

Figure 1:
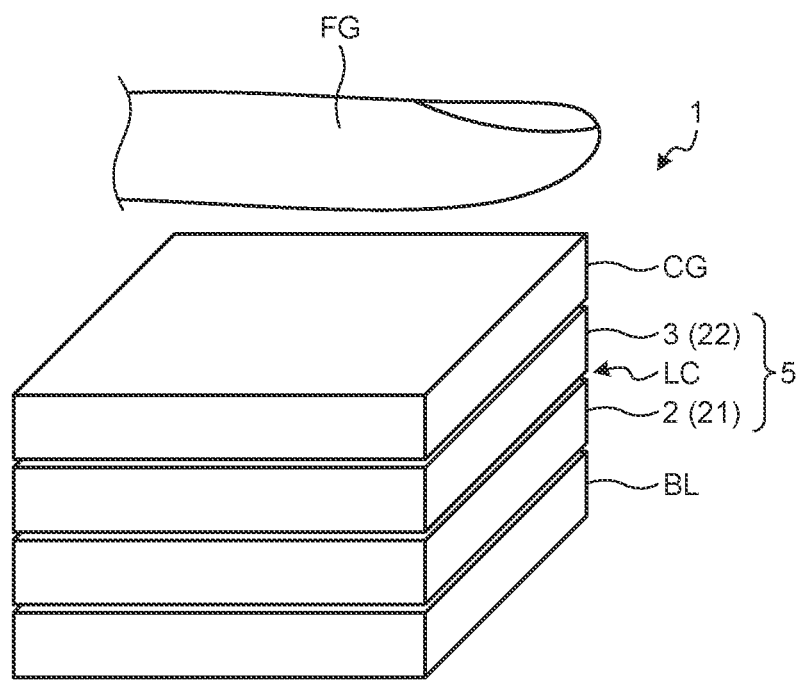
FIG. 1 is a perspective view schematically illustrating a display device according to a first embodiment.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, simply expressing "on" includes both a case of disposing the other structure immediately on the certain structure so as to contact the certain structure and a case of disposing the other structure above the certain structure with still another structure interposed therebetween, unless otherwise specified.

First Embodiment

Figure 2:
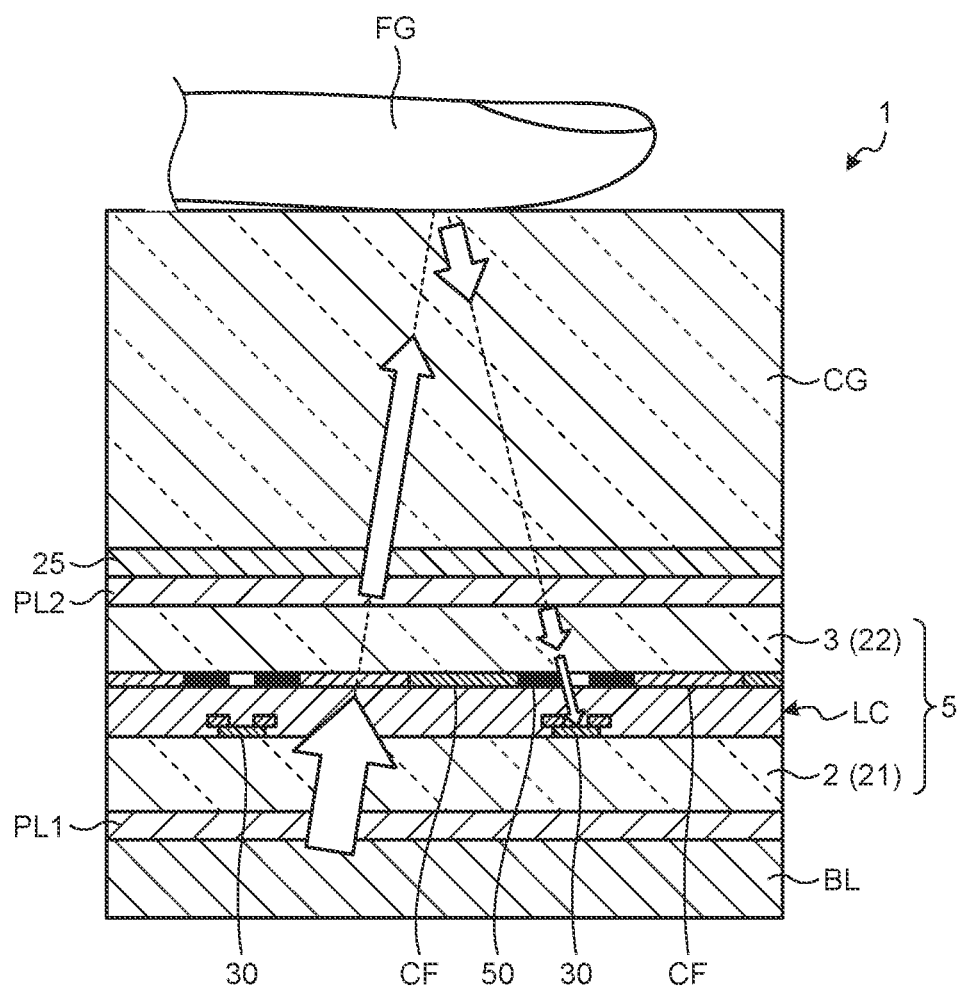
FIG. 2 is a sectional view illustrating a schematic sectional configuration of the display device according to the first embodiment.

FIG. 1 is a perspective view illustrating a display device according to a first embodiment. FIG. 2 is a sectional view illustrating a schematic sectional configuration of the display device according to the first embodiment. A display device 1 according to the present embodiment is a display device with an optical sensor (photodiodes 30 (refer to FIG. 2)) in which an optical sensor and a display panel 5 are integrated together. The term "integrated" indicates that the photodiodes 30 are built into the display panel 5, and that at least some of a substrate, wiring, and the like forming the display panel 5 are shared by the photodiodes 30.

As illustrated in FIGS. 1 and 2, the display device 1 includes the display panel 5, a backlight BL, and a cover member CG. The display panel 5 and the cover member CG are stacked on the backlight BL in this order.

As illustrated in FIG. 2, the display panel 5 includes an array substrate 2, a counter substrate 3, and a liquid crystal layer LC. The array substrate 2 includes a first substrate 21 serving as a base and is a drive circuit substrate for driving a plurality of pixels PX (refer to FIG. 3). The photodiode 30 is provided on the first substrate 21. In other words, the array substrate 2 serves as both the drive circuit substrate for driving the plurality of pixels PX (refer to FIG. 3) and the drive circuit substrate for driving the optical sensor including a plurality of photodiodes 30.

The counter substrate 3 includes a second substrate 22 serving as a base and is provided opposing the array substrate 2. The liquid crystal layer LC, which is a display function layer, is provided between the array substrate 2 and the counter substrate 3. The first and the second substrates 21 and 22 are, for example, glass substrates. Alternatively, the first and the second substrates 21 and 22 may be resin substrates. In this case, the display device 1 may be configured as a flexible sensor. On a surface of the second substrate 22 facing the first substrate 21, a color filter CF and an optical filter layer 50 are provided. The color filter CF is configured to transmit light in different colors (red (R), green (G) and blue (B)) for different regions corresponding to a first sub-pixel SPX1, a second sub-pixel SPX2, and a third sub-pixel SPX3 (refer to FIG. 5).

The optical filter layer 50 is disposed opposing the photodiodes 30 and between the photodiodes 30 and both the counter substrate 3 and an object to be detected FG such as a finger. The optical filter layer 50 is provided in the same layer as the color filter CF and has a plurality of light guiding paths and a light shield provided around the plurality of light guiding paths. At least part of the light guiding paths overlaps the photodiode 30. The light absorptance of the light shield is higher than that of the light guiding path. The optical filter layer 50 is an optical element that transmits, to the photodiode 30, light with an incident angle equal to or less than a predetermined angle with respect to the second substrate 22 among the light reflected by the object to be detected FG, such as a finger. The optical filter layer 50 is also called a collimator aperture or collimator.

A first polarization plate PL1 is provided on the lower side of the first substrate 21 (the side facing the backlight BL). A second polarization plate PL2 is provided on the upper side of the second substrate 22 (the side facing the cover member CG). The first polarization plate PL1, the array substrate 2, the counter substrate 3, and the second polarization plate PL2 are stacked in this order in the direction perpendicular to the array substrate 2.

The cover member CG is bonded onto the second polarization plate PL2 with an adhesive layer 25 interposed therebetween. The cover member CG is formed of, for example, a glass substrate or a resin substrate.

The backlight BL is provided under the array substrate 2. The backlight BL may be, for example, what is called a side light-type backlight that includes a light guiding plate provided in a position corresponding to a display region AA and a plurality of light sources arranged at one end or both ends of the light guiding plate. For example, light-emitting diodes (LEDs) for emitting light in a predetermined color are used as the light sources. The backlight BL may be what is called a direct-type backlight that includes the light sources (such as the LEDs) provided directly under the display region AA.

The display device 1 (display panel 5) is, for example, a liquid crystal display (LCD). However, the present disclosure is not limited thereto. The display device 1 may be, for example, an organic electroluminescent (EL) diode (organic light-emitting diode (OLED)) panel or an inorganic EL display panel (micro-LED or mini-LED). Alternatively, the display device 1 may be an electrophoretic display (EPD) panel using electrophoretic elements as display elements.

The object to be detected FG is, for example, the finger, a palm, a wrist, or the like. For example, the display panel 5 with the photodiodes 30 (optical sensor) can detect information such as a fingerprint of the object to be detected FG based on light. The display panel 5 with the photodiodes 30 (optical sensor) may also detect various types of information (biometric information), for example, shape of blood vessels, pulsation, pulse wave, and the like. That is, the display device 1 may be configured as a fingerprint detection device to detect the fingerprint or a vein detection device to detect a vascular pattern of, for example, veins. The light sources included in the backlight BL are not limited to one type, and multiple types with different wavelengths may be provided.

FIGS. 1 and 2 are schematic diagrams and can be changed as appropriate. For example, the optical filter layer 50 may be provided in a different layer from the color filter CF.

Figure 3:
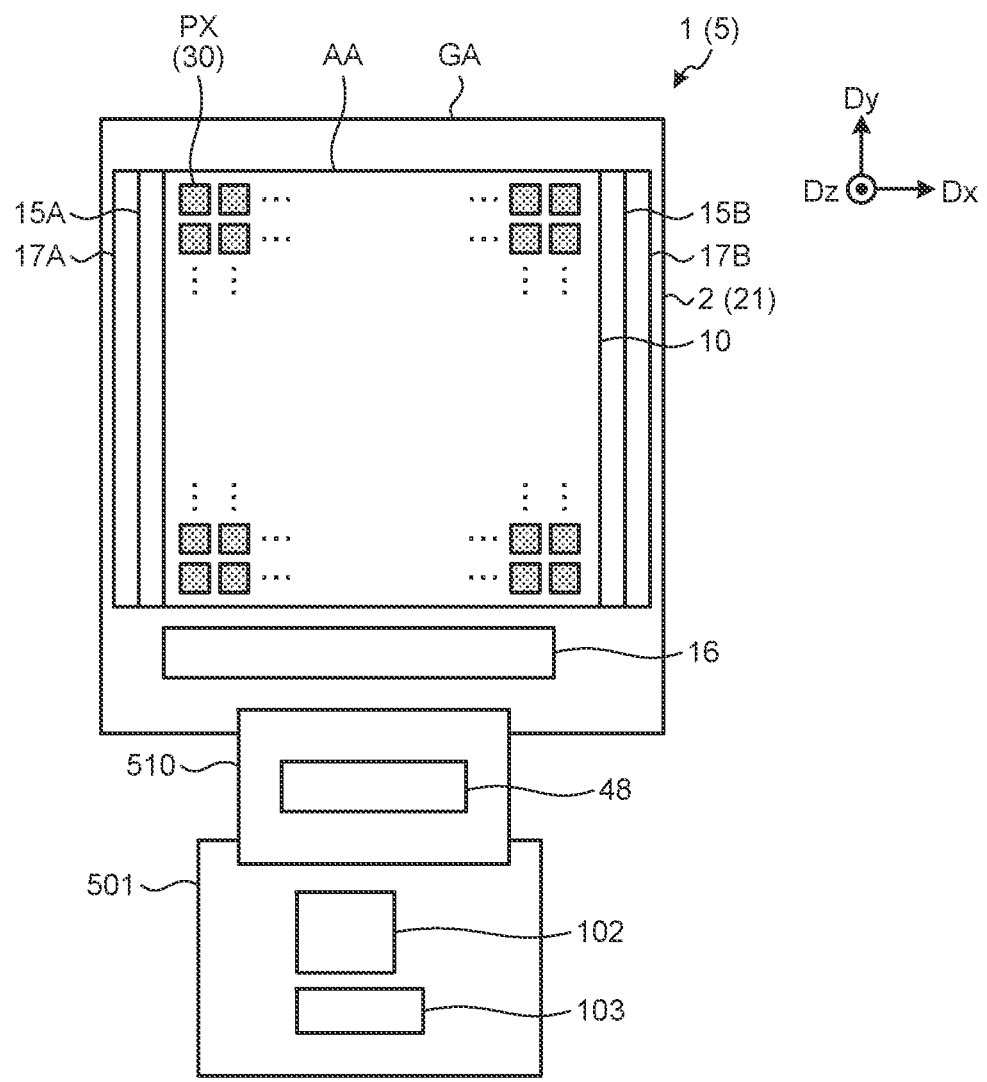
FIG. 3 is a plan view illustrating the display device according to the first embodiment.

FIG. 3 is a plan view illustrating the display device according to the first embodiment. As illustrated in FIG. 3, the display panel 5 included in the display device 1 includes the array substrate 2 (first substrate 21), a display circuit 10, a first scanning line drive circuit 15A, a second scanning line drive circuit 15B, a signal line selection circuit 16, a first decoder circuit 17A, a second decoder circuit 17B, a detection circuit 48, a control circuit 102, and a power supply circuit 103. In the following description, the first scanning line drive circuit 15A and the second scanning line drive circuit 15B may be simply referred to as a scanning line drive circuit 15 when need not be distinguished from one another. The first decoder circuit 17A and the second decoder circuit 17B may be simply referred to as a decoder circuit 17 when need not be distinguished from one another.

In the following description, a first direction Dx is one direction in a plane parallel to the first substrate 21. A second direction Dy is one direction in the plane parallel to the first substrate 21 and is a direction orthogonal to the first direction Dx. The second direction Dy may non-orthogonally intersect the first direction Dx. A third direction Dz is a direction orthogonal to the first direction Dx and the second direction Dy and is a direction normal to a main surface of the first substrate 21. The term "plan view" refers to a positional relation when viewed from a direction orthogonal to the first substrate 21.

The first substrate 21 is electrically coupled to a control substrate 501 through a wiring substrate 510. The wiring substrate 510 is, for example, a flexible printed circuit board or a rigid circuit board. The wiring substrate 510 is provided with the detection circuit 48. The control substrate 501 is provided with the control circuit 102 and the power supply circuit 103. The control circuit 102 is, for example, a field-programmable gate array (FPGA). The control circuit 102 supplies control signals to the display circuit 10, the scanning line drive circuit 15, the signal line selection circuit 16, and the decoder circuit 17 to control a display operation of the display circuit 10 and a detection operation of the photodiode 30. The control circuit 102 supplies control signals to the backlight BL (refer to FIGS. 1 and 2) to control lighting and non-lighting of the light sources. The power supply circuit 103 supplies voltage signals including, for example, a reset potential VPP1, a power supply potential VPP2, a display reference potential COM, and a reference potential VCOM (refer to FIG. 5) to the display circuit 10, the scanning line drive circuit 15, and the signal line selection circuit 16.

The first substrate 21 has the display region AA and a peripheral region GA. The display region AA is a region where the pixels PX are provided. The pixels PX are arranged in a matrix having a row-column configuration in the display region AA. Each of the pixels PX is provided with the photodiode 30. The display region AA is a region provided with the photodiodes 30 included in the display circuit 10 and also serves as a detection region of the optical sensor. The peripheral region GA is a region between an outer perimeter of the display region AA and an outer edge of the first substrate 21 and is a region not provided with the pixels PX (photodiodes 30).

The present disclosure is not limited to the configuration in which the photodiodes 30 are respectively provided in all of the pixels PX. The photodiodes 30 may be provided in two or more of the pixels PX, respectively. The photodiodes 30 may be arranged over the entire display region AA, or they may be arranged over a part of the display region AA that has been previously set as the detection region of the object to be detected FG.

The scanning line drive circuit 15 and the signal line selection circuit 16 are provided in the peripheral region GA. Specifically, the scanning line drive circuit 15 is provided in a region extending along the second direction Dy in the peripheral region GA. The signal line selection circuit 16 is provided in a region extending along the first direction Dx in the peripheral region GA and is provided between the display circuit 10 and the detection circuit 48. As illustrated in FIG. 3, the first scanning line drive circuit 15A and the first decoder circuit 17A are provided in the peripheral region GA adjacent to the left side of the display circuit 10. The second scanning line drive circuit 15B and the second decoder circuit 17B are provided in the peripheral region GA adjacent to the right side of the display circuit 10. In other words, in the first direction Dx, the display circuit 10 is disposed between both the first scanning line drive circuit 15A and the first decoder circuit 17A, and both the second scanning line drive circuit 15B and the second decoder circuit 17B.

Each of the pixels PX in the display circuit 10 has a sensor element in addition to the display element. Each of the pixels PX has the photodiode 30 as the sensor element. The photodiode 30 is a photoelectric conversion element and outputs an electrical signal corresponding to light projected onto the photodiode 30. More specifically, the photodiode 30 is a positive-intrinsic-negative (PIN) photodiode or an organic photodiode (OPD) using an organic semiconductor. The photodiodes 30 are arranged in a matrix having a row-column configuration in the display region AA.

The photodiodes 30 included in the pixels PX perform the detection according to a sensor control signal (for example, a reset control signal RST or a read control signal RD) supplied from the scanning line drive circuit 15. Each of the photodiodes 30 outputs the electrical signal corresponding to the light projected onto the photodiode 30 as a detection signal Vdet to the signal line selection circuit 16. The display device 1 detects the information on the object to be detected FG based on the detection signals Vdet received from the photodiodes 30.

Figure 4:
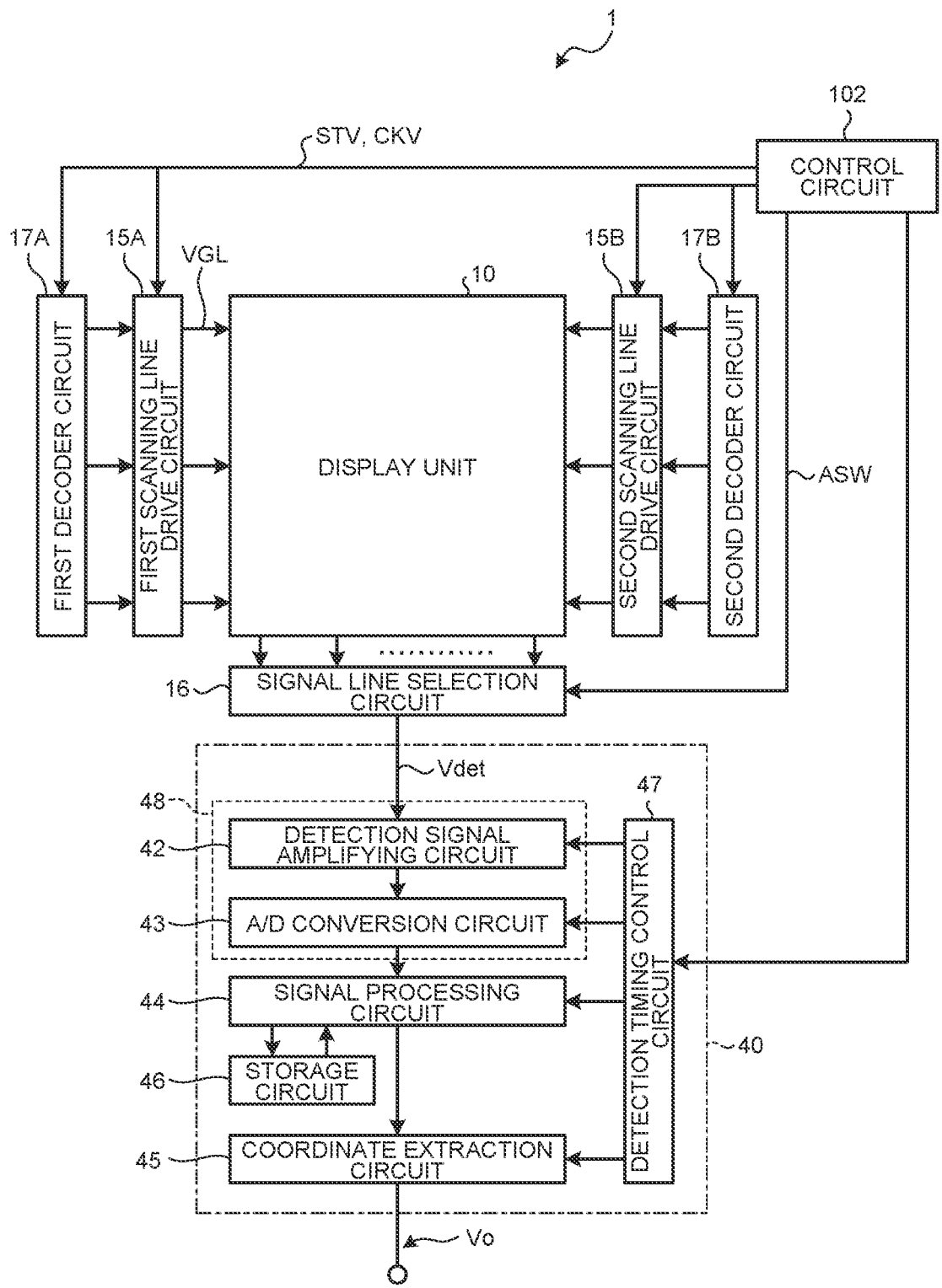
FIG. 4 is a block diagram illustrating a configuration example of the display device according to the first embodiment.

FIG. 4 is a block diagram illustrating a configuration example of the display device according to the first embodiment. As illustrated in FIG. 4, the display device 1 further includes a detector (detection processing circuit) 40. The control circuit 102 includes one, some, or all functions of the detector 40.

The control circuit 102 is a circuit that supplies respective control signals to the scanning line drive circuit 15 (the first scanning line drive circuit 15A and the second scanning line drive circuit 15B), the signal line selection circuit 16, the decoder circuit 17 (the first decoder circuit 17A and the second decoder circuit 17B), and the detector 40 to control operations thereof. The control circuit 102 supplies various control signals such as a start control signal STV and a clock signal CKV to the scanning line drive circuit 15. The control circuit 102 also supplies various control signals including, for example, a selection signal ASW to the signal line selection circuit 16.

The scanning line drive circuit 15 is a circuit that drives a plurality of scanning lines (refer to FIG. 5) based on the various control signals. The scanning line drive circuit 15 serves as both a drive circuit for scanning the pixels PX and a drive circuit for scanning the photodiodes 30. The scanning line drive circuit 15 sequentially or simultaneously selects the scanning lines and supplies a gate drive signal VGL or the sensor control signal (the reset control signals RST or the read control signals RD) to the selected scanning lines. By this operation, the scanning line drive circuit 15 selects the pixels PX or the photodiodes 30 coupled to the scanning lines. The detailed configuration and operation of the scanning line drive circuit 15 will be described later.

Figure 5:
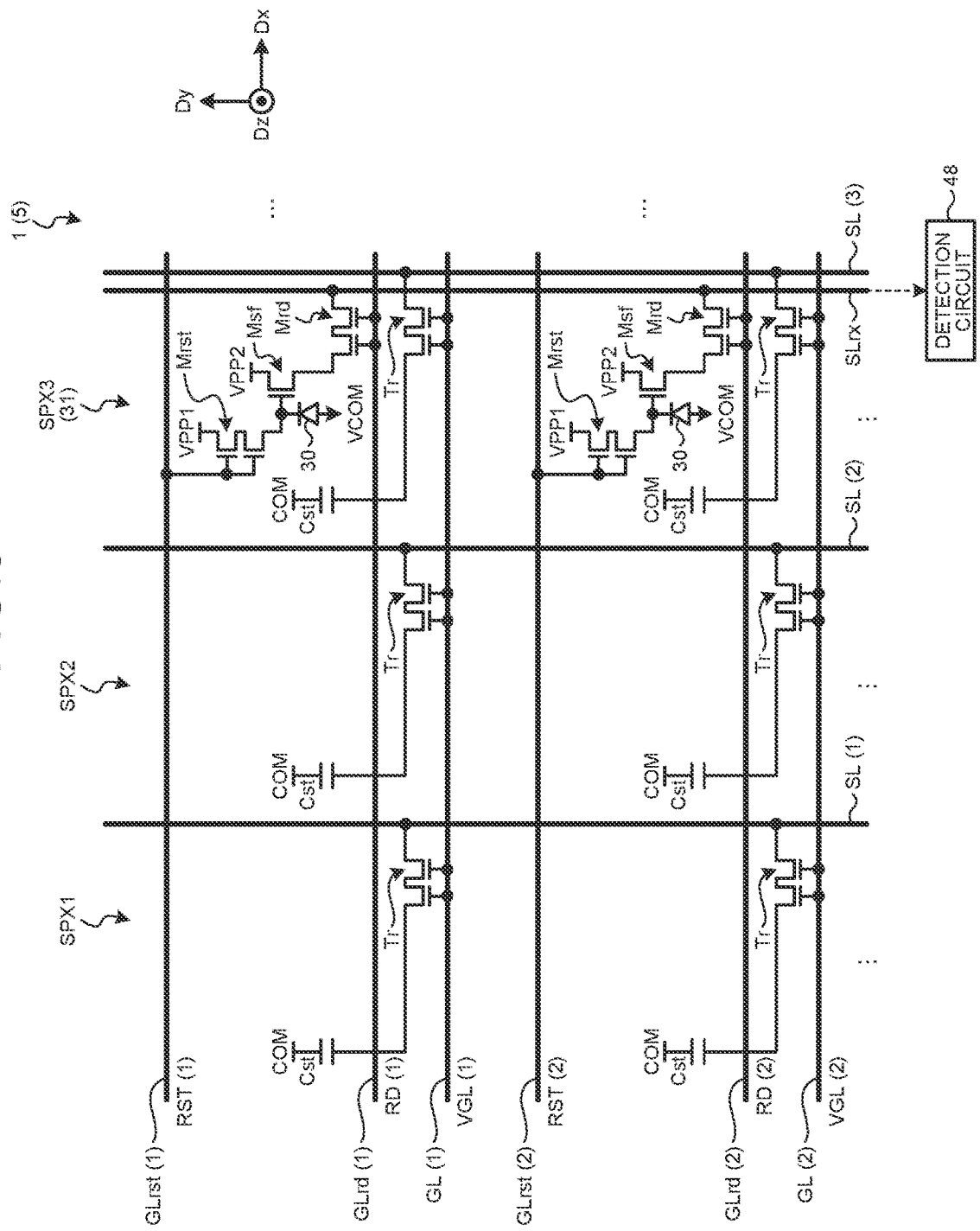
FIG. 5 is a circuit diagram illustrating a plurality of pixels and detection elements.

The signal line selection circuit 16 is a switching circuit that sequentially or simultaneously selects a plurality of output signal lines SLrx (refer to FIG. 5). The signal line selection circuit 16 is, for example, a multiplexer. The signal line selection circuit 16 couples the selected output signal lines SLrx to the detection circuit 48 based on the selection signal ASW supplied from the control circuit 102. By this operation, the signal line selection circuit 16 outputs the detection signals Vdet of the photodiodes 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the control circuit 102.

The detection circuit 48 is, for example, an analog front-end (AFE) circuit. The detection circuit 48 is a signal processing circuit having at least functions of a detection signal amplifying circuit 42 and an analog-to-digital (A/D) conversion circuit 43. The detection signal amplifying circuit 42 amplifies the detection signal Vdet. The A/D conversion circuit 43 converts an analog signal output from the detection signal amplifying circuit 42 into a digital signal.

The signal processing circuit 44 is a logic circuit that detects a predetermined physical quantity input to the optical sensor (the photodiodes 30) included in the display circuit 10 based on output signals of the detection circuit 48. When a finger is in contact with or in proximity to a detection surface (the surface of the cover member CG), the signal processing circuit 44 can detect the asperities on the surface of the finger or the palm based on the signals from the detection circuit 48. The signal processing circuit 44 can also detect the information on the living body based on the signal from the detection circuit 48. Examples of the information on the living body include the vascular image, the pulse wave, the pulsation, and the blood oxygen level of the finger or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger or the like when the contact or proximity of the finger is detected by the signal processing circuit 44. The coordinate extraction circuit 45 is the logic circuit that also obtains detected coordinates of blood vessels of the finger or the palm. The coordinate extraction circuit 45 combines the detection signals Vdet output from the respective photodiodes 30 of the display circuit 10 to generate two-dimensional information indicating the shape of the asperities on the surface of the finger or the like and two-dimensional information indicating the shape of the blood vessels of the finger or the palm. The coordinate extraction circuit 45 may output the detection signals Vdet as a sensor output voltage Vo instead of calculating the detected coordinates.

The following describes a circuit configuration example of the display circuit 10 of the display device 1. FIG. 5 is a circuit diagram illustrating a plurality of pixels and detection elements. As illustrated in FIG. 5, the pixel PX includes display elements. The pixel PX includes, as the display elements, the first sub-pixel SPX1, the second sub-pixel SPX2, and the third sub-pixel SPX3. In the following description, the first sub-pixel SPX1, the second sub-pixel SPX2, and the third sub-pixel SPX3 may be simply referred to as a sub-pixel SPX when need not be distinguished from one another.

The color filter CF (refer to FIG. 2) has three color regions colored in, for example, red (R), green (G), and blue (B) that are arranged periodically. The first sub-pixel SPX1, the second sub-pixel SPX2, and the third sub-pixel SPX3 are associated with a set of three color regions of R, G, and B, respectively. Then, the pixel PX is configured as a set of sub-pixels SPX corresponding to the three color regions. The color filter CF may include more than four color regions. In this case, the pixels PX may include four or more sub-pixels SPX.

Each sub-pixel SPX has a capacitor Cst of a transistor Tr and a liquid crystal layer LC. The transistor Tr, a pixel signal line SL, a pixel scanning line GL, and the like of each sub-pixel SPX illustrated in FIG. 5 are formed on the array substrate 2. One end side of the capacitor Cst is coupled to the display reference potential COM, and the other end side of the capacitor Cst is coupled to either a source or a drain of the transistor Tr. The pixel signal line SL is coupled to the other of the sources or the drains of the transistor Tr. The pixel scanning line GL is coupled to a gate of transistor Tr.

The first scanning line drive circuit 15A and the second scanning line drive circuit 15B sequentially or simultaneously supply gate drive signals VGL to pixel scanning lines GL(1), GL(2), . . . . By this operation, a plurality of sub-pixels SPX coupled to the pixel scanning lines GL are selected. The pixel signal line SL is a wiring line to supply pixel signals to the sub-pixels SPX. The control circuit 102 supplies image signals to the sub-pixels SPX selected via the pixel signal lines SL.

A detection element 31 including the photodiode 30 is provided in the third sub-pixel SPX3, which displays blue color. The first sub-pixel SPX1 and the second sub-pixel SPX2 corresponding to red and green are not provided with the detection element 31 including the photodiode 30.

As illustrated in FIG. 5, each of the detection elements 31 includes the photodiode 30, a reset transistor Mrst, a read transistor Mrd, and a source follower transistor Msf. The reset transistor Mrst, the read transistor Mrd, and the source follower transistor Msf are provided corresponding to each of the photodiodes 30. The reset transistor Mrst, read transistor Mrd, and source follower transistor Msf are each configured with a thin-film transistor, for example, an n-type thin film transistor (TFT). However, each of the transistors is not limited thereto and may be configured with a p-type TFT.

The reference potential VCOM is applied to an anode of the photodiode 30. A cathode of the photodiode 30 is coupled to either the source or the drain of the reset transistor Mrst, and to the gate of the source follower transistor Msf. In addition, there is a sensor capacitor (not illustrated) in the photodiode 30. The sensor capacitor is, for example, a capacitor formed between the anode and cathode of the photodiode 30. When light enters the photodiode 30, the signal (electric charge) output from the photodiode 30 is stored in the sensor capacitor.

The gate of the reset transistor Mrst is coupled to a corresponding one of the reset control scanning lines GLrst. The other of the source and the drain of the reset transistor Mrst is supplied with the reset potential VPP1. When the reset transistor Mrst is turned on (into a conduction state) in response to the reset control signal RST, a potential of the cathode of the photodiode 30 is reset to the reset potential Vrst. The reference potential VCOM has a potential lower than the reset potential Vrst, and the photodiode 30 is driven in a reverse bias.

The source follower transistor Msf is coupled between a terminal supplied with the power supply potential VPP2 and the read transistor Mrd. The gate of the source follower transistor Msf is coupled to the cathode of the photodiode 30 and either the source or the drain of the reset transistor Mrst. The gate of the source follower transistor Msf is supplied with the signal (electrical charge) generated by the photodiode 30. This operation causes the source follower transistor Msf to output a voltage signal corresponding to the signal (electrical charge) generated by the photodiode 30 to the read transistor Mrd.

The read transistor Mrd is coupled between the source of the source follower transistor Msf and a corresponding one of the output signal lines SLrx. The gate of the read transistor Mrd is coupled to a corresponding one of the read control scanning lines GLrd. When the read transistor Mrd is turned on in response to the read control signal RD, the signal output from the source follower transistor Msf, that is, the voltage signal corresponding to the signal (electric charge) generated by the photodiode 30 is output as the detection signal Vdet to the output signal line SLrx.

In the example illustrated in FIG. 5, the reset transistor Mrst and the read transistor Mrd each have what is called a double-gate structure in which two transistors are coupled in series. However, the present disclosure is not limited to this configuration, and the reset transistor Mrst and the read transistor Mrd may have a single-gate structure or a multi-gate structure with three or more transistors coupled in series. The circuit of each of the detection elements 31 is not limited to the configuration including the three transistors of the reset transistor Mrst, the source follower transistor Msf, and the read transistor Mrd. The detection element 31 may have two or four or more transistors.

The pixel scanning line GL, the reset control scanning line GLrst, and the read control scanning line GLrd are provided for each of the rows, each of which includes the sub-pixels SPX aligned in a row. The reset control scanning line GLrst and the read control scanning line GLrd, which are coupled to the detection element 31, extend along an extending direction of the pixel scanning line GL coupled to the sub-pixels SPX, and the reset control scanning line GLrst and the read control scanning line GLrd are arranged alternately in a direction orthogonal to the extending direction of the pixel scanning line GL. In the example illustrated in FIG. 5, a reset control scanning line GLrst(1), a read control scanning line GLrd(1), the pixel scanning line GL(1), a reset control scanning line GLrst(2), a read control scanning line GLrd(2), a pixel scanning line GL(2), . . . are arranged alternately in this order.

Figure 6:
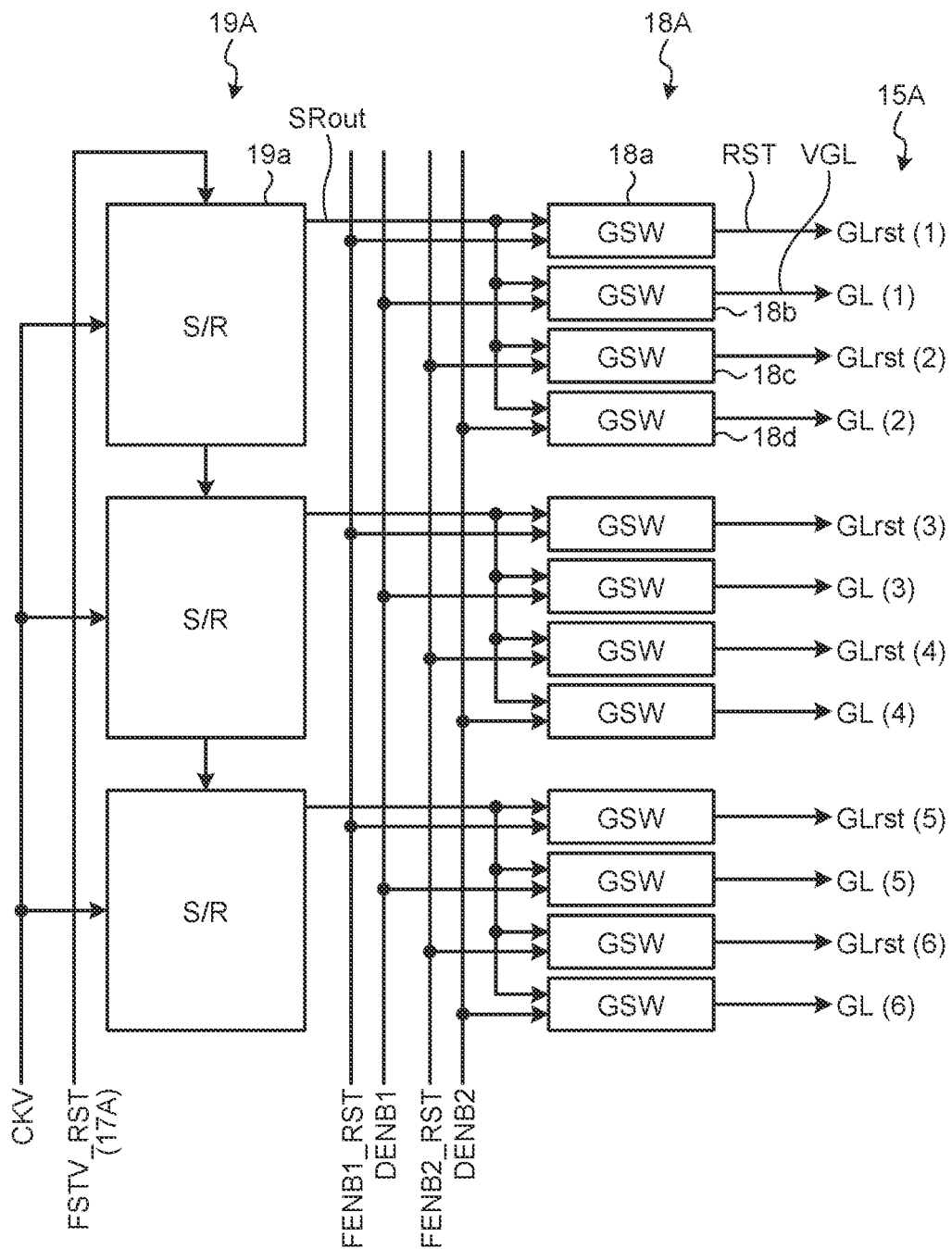
FIG. 6 is a circuit diagram schematically illustrating a first scanning line drive circuit.

The following describes a circuit configuration example of the first scanning line drive circuit 15A and the second scanning line drive circuit 15B. FIG. 6 is a circuit diagram schematically illustrating the first scanning line drive circuit. As illustrated in FIG. 6, the first scanning line drive circuit 15A includes a first shift register circuit 19A and a first switching circuit 18A. The first shift register circuit 19A is a circuit that sequentially outputs output signals SRout to the pixels PX (sub-pixels SPX) and the photodiodes 30. The first switching circuit 18A is a circuit that switches the coupling between the first shift register circuit 19A and the pixels PX (sub-pixels SPX), and the coupling between the first shift register circuit 19A and the photodiodes 30.

The first shift register circuit 19A is provided corresponding to the pixel scanning lines GL and the reset control scanning lines GLrst. More precisely, the first shift register circuit 19A has a plurality of sequential circuits 19a. The sequential circuits 19a are arranged in an arrangement direction (second direction Dy) of the pixel scanning lines GL and the reset control scanning lines GLrst. The sequential circuits 19a sequentially output an output signal SRout to the first switching circuit 18A based on the clock signal CKV supplied from the control circuit 102 and a start control signal FSTV_RST supplied from the first decoder circuit 17A.

The first switching circuit 18A has a plurality of switching elements 18a, 18b, 18c, and 18d. The switching elements 18a, 18b, 18c, and 18d are arranged in the arrangement direction (second direction Dy) of the pixel scanning lines GL and the reset control scanning lines GLrst. In the example illustrated in FIG. 6, four switching elements 18a, 18b, 18c, and 18d are coupled to one sequential circuit 19a. The four switching elements 18a, 18b, 18c, and 18d are coupled to the pixel scanning lines GL and the reset control scanning lines GLrst, respectively.

To describe the sequential circuit 19a of the first stage in detail, the switching element 18a is coupled to the reset control scanning line GLrst(1), the switching element 18b is coupled to the pixel scanning line GL(1), the switching element 18c is coupled to the reset control scanning line GLrst(2), and the switching element 18d is coupled to the pixel scanning line GL(2). In other words, one sequential circuit 19a is provided corresponding to two rows of the pixels PX and two rows of the photodiodes 30.

The switching element 18a is supplied with the output signal SRout from the sequential circuit 19a and a first detection control signal FENB1_RST from the control circuit 102. Based on these signals, the switching element 18a supplies the reset control signal RST to the reset control scanning line GLrst(1).

The switching element 18b is supplied with the output signal SRout from the sequential circuit 19a and a first display control signal DENB1 from the control circuit 102. Based on these signals, the switching element 18b supplies the gate drive signal VGL to the pixel scanning line GL(1).

The switching element 18c is supplied with the output signal SRout from the sequential circuit 19a and a second detection control signal FENB2_RST from the control circuit 102. Based on these signals, the switching element 18c supplies the reset control signal RST to the reset control scanning line GLrst(2).

The switching element 18d is supplied with the output signal SRout from the sequential circuit 19a and a second display control signal DENB2 from the control circuit 102. Based on these signals, the switching element 18d supplies the gate drive signal VGL to the pixel scanning line GL(2).

In the same manner as the sequential circuit 19a of each of the second and subsequent stages, the switching elements 18a, 18b, 18c, and 18d output the reset control signal RST or the gate drive signal VGL based on the output signal SRout from the sequential circuit 19a and the control signal from the control circuit 102.

Figure 7:
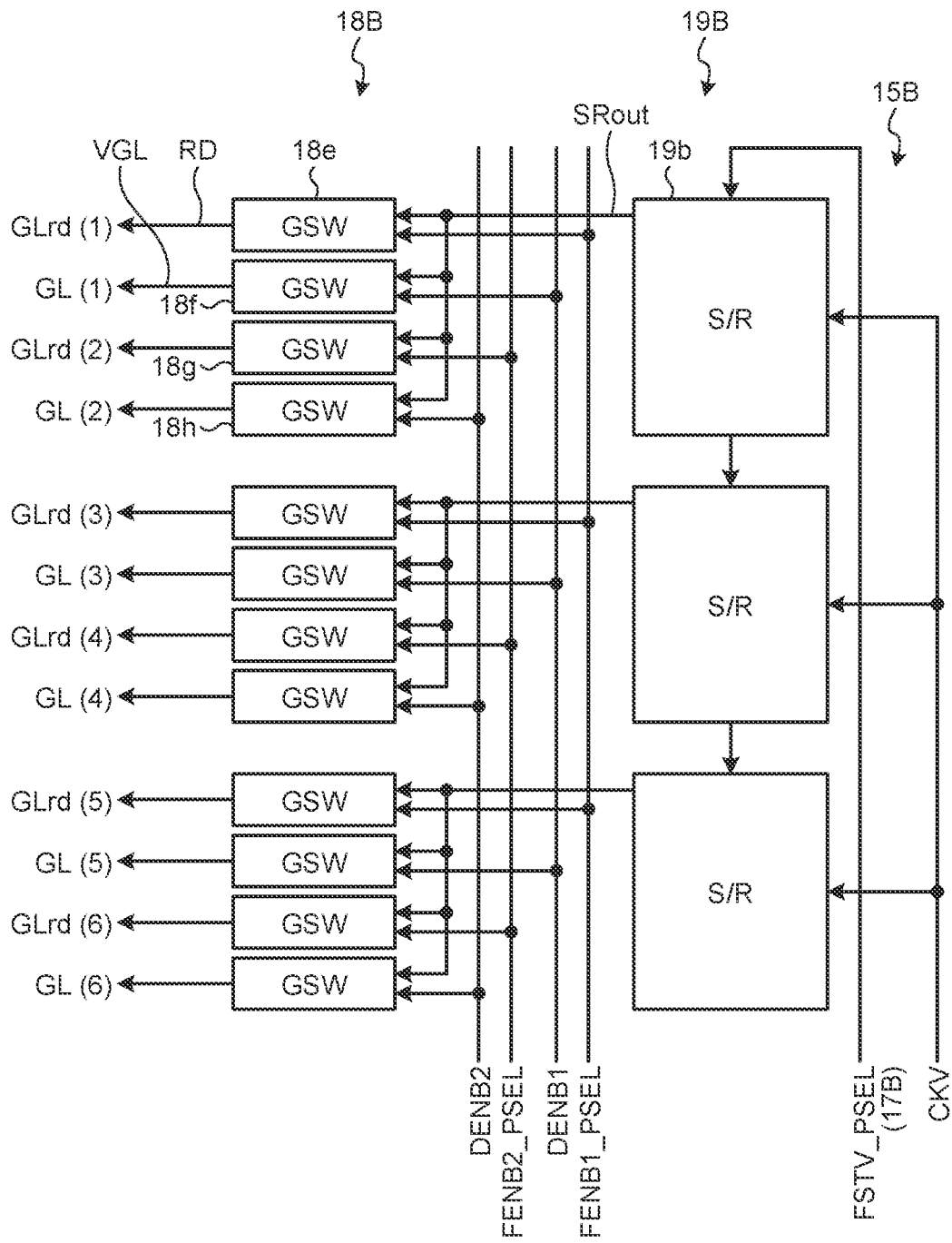
FIG. 7 is a circuit diagram schematically illustrating a second scanning line drive circuit.

FIG. 7 is a circuit diagram schematically illustrating the second scanning line drive circuit. As illustrated in FIG. 7, the second scanning line drive circuit 15B includes a second shift register circuit 19B and a second switching circuit 18B. The second scanning line drive circuit 15B is similar to the first scanning line drive circuit 15A and has a circuit configuration that is obtained by horizontally inverting the first scanning line drive circuit 15A. In the description of the second scanning line drive circuit 15B, repetitive descriptions of the common configuration with the first scanning line drive circuit 15A may be omitted.

The second shift register circuit 19B of the second scanning line drive circuit 15B is provided corresponding to the pixel scanning lines GL and the read control scanning lines GLrd. More precisely, the second shift register circuit 19B has a plurality of sequential circuits 19b. The sequential circuits 19b are arranged in the arrangement direction (second direction Dy) of the pixel scanning lines GL and the read control scanning lines GLrd. The sequential circuits 19b sequentially output the output signal SRout to the second switching circuit 18B based on the clock signal CKV supplied from the control circuit 102 and a start control signal FSTV_PSEL supplied from the second decoder circuit 17B.

The second switching circuit 18B of the second scanning line drive circuit 15B has a plurality of switching elements 18e, 18f, 18g, and 18h. The switching elements 18e, 18f, 18g, and 18h are arranged in the arrangement direction (second direction Dy) of the pixel scanning lines GL and the read control scanning lines GLrd. In the example illustrated in FIG. 7, four switching elements 18e, 18f, 18g, and 18h are coupled to one sequential circuit 19b. The four switching elements 18e, 18f, 18g, and 18h are coupled to the pixel scanning lines GL and the read control scanning lines GLrd, respectively.

To describe the sequential circuit 19b of the first stage in detail, the switching element 18e is coupled to the read control scanning line GLrd(1), the switching element 18f is coupled to the pixel scanning line GL(1), the switching element 18g is coupled to the read control scanning line GLrd(2), and the switching element 18h is coupled to the pixel scanning line GL(2).

The switching element 18e is supplied with the output signal SRout from the sequential circuit 19b and a third detection control signal FENB1_PSEL from the control circuit 102. Based on these signals, the switching element 18e supplies the read control signal RD to the read control scanning line GLrd(1).

The switching element 18f is supplied with the output signal SRout from the sequential circuit 19b and the first display control signal DENB1 from the control circuit 102. Based on these signals, the switching element 18f supplies the gate drive signal VGL to the pixel scanning line GL(1).

The switching element 18g is supplied with the output signal SRout from the sequential circuit 19b and a fourth detection control signal FENB2_PSEL from the control circuit 102. Based on these signals, the switching element 18g supplies the read control signal RD to the read control scanning line GLrd(2).

The switching element 18h is supplied with the output signal SRout from the sequential circuit 19b and the second display control signal DENB2 from the control circuit 102. Based on these signals, the switching element 18h supplies the gate drive signal VGL to the pixel scanning line GL(2).

In the same manner as the sequential circuit 19b of each of the second and subsequent stages, the switching elements 18e, 18f, 18g, and 18h output the read control signal RD or the gate drive signal VGL based on the output signal SRout from the sequential circuit 19b and the control signal from the control circuit 102.

Thus, in the display device 1, the first scanning line drive circuit 15A and the second scanning line drive circuit 15B output the control signals (gate drive signal VGL, reset control signal RST, and read control signal RD) to the pixels PX and the photodiodes 30. Specifically, the first and second shift register circuits 19A, 19B (sequential circuits 19a and 19b) are common to the pixels PX and the photodiodes 30 and output the common output signal SRout. The clock signal CKV and the start control signals FSTV_RST and FSTV_PSEL supplied to the first and second shift register circuits 19A, 19B are also common to the pixels PX and the photodiodes 30. This allows the display device 1 to be provided with the peripheral region GA having a narrower frame compared to the case where the drive circuit for scanning the pixels PX and the drive circuit for scanning the photodiodes 30 are provided separately.

In the first switching circuit 18A of the first scanning line drive circuit 15A, the switching elements 18a and 18c, which are coupled to the photodiodes 30, and the switching elements 18b and 18d, which are coupled to the pixels PX, are arranged in the second direction Dy. Similarly, in the second switching circuit 18B of the second scanning line drive circuit 15B, the switching elements 18e and 18g, which are coupled to photodiodes 30, and the switching elements 18f and 18h, which are coupled to pixels PX, are arranged in the second direction Dy. In the first direction Dx, the display region AA (refer to FIG. 3) is disposed between the first shift register circuit 19A and the first switching circuit 18A, and the second shift register circuit 19B and the second switching circuit 18B.

The circuit configurations of the first scanning line drive circuit 15A and the second scanning line drive circuit 15B illustrated in FIGS. 6 and 7 are only examples and may be changed as appropriate. For example, the number of the switching elements, the pixels PX, and the photodiodes 30 coupled to one sequential circuit 19a or 19b illustrated in FIGS. 6 and 7 can be changed as appropriate. It is sufficient that each of the sequential circuits 19a and 19b is provided with at least one row of pixels PX and at least one row of photodiodes 30.

Figure 8:
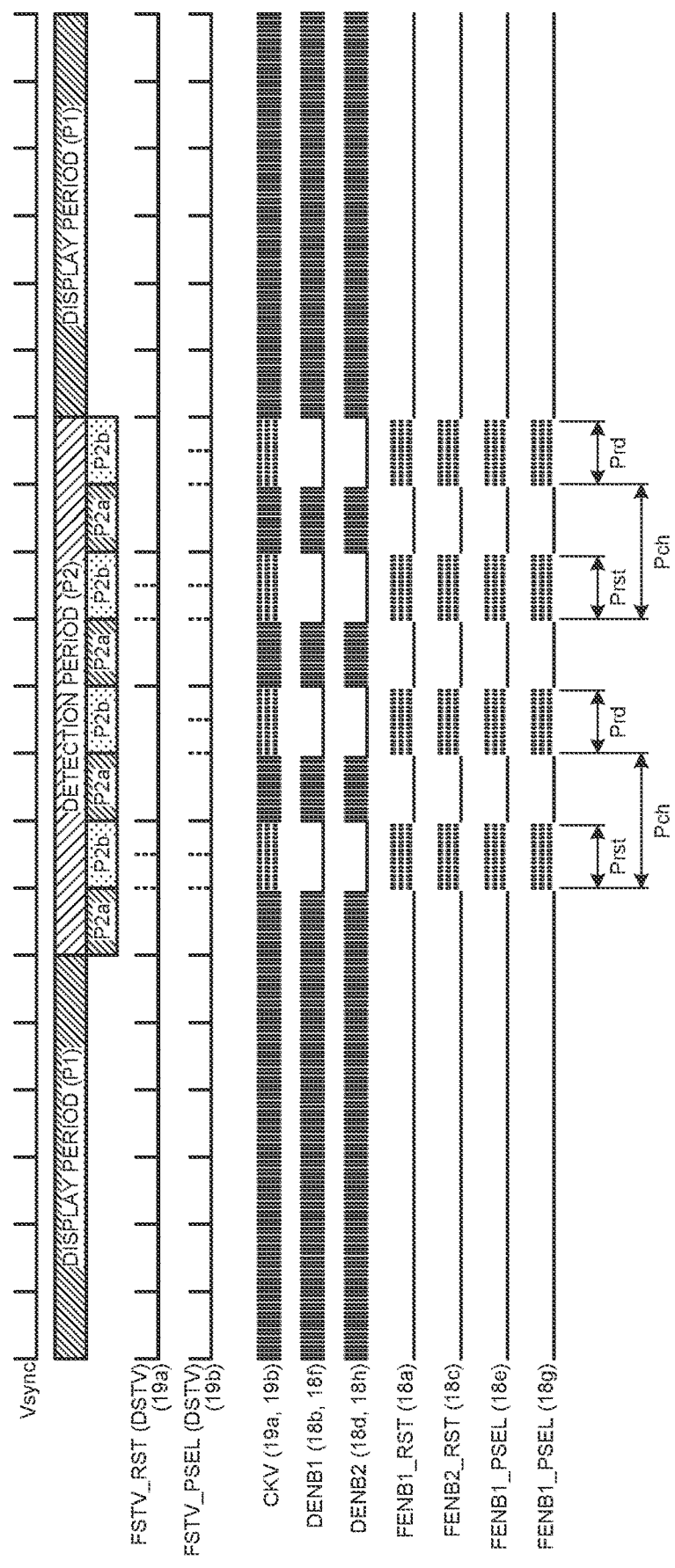
FIG. 8 is a timing waveform diagram illustrating a display period and a detection period.

The following describes an operation example of the first scanning line drive circuit 15A and the second scanning line drive circuit 15B. FIG. 8 is a timing waveform diagram illustrating a display period and a detection period. FIG. 8 illustrates a schematic operation example of a display period P1 and a detection period P2, and the details of each period are described in FIGS. 9 to 11.

As illustrated in FIG. 8, the control circuit 102 controls the display period P1 for display by the pixels PX and the detection period P2 for detection by the photodiodes 30 in a time division manner. The display period P1 and detection period P2 are arranged alternately, for example, in the order of the display period P1, the detection period P2, the display period P1, detection period P2, . . . .

In the detection period P2, the control circuit 102 further controls a first detection period P2a and a second detection period P2b in a time division manner. The second detection period P2b is a period corresponding to the reset period Prst or the read period Prd of the photodiode 30. The first detection period P2a is a period in which resetting and reading of the photodiodes 30 is not performed, and mainly corresponds to the exposure period Pch of the photodiode 30. The display device 1 according to the present embodiment drives the pixels PX in each of the first detection periods P2a to display. In other words, in the first detection period P2a, the exposure period Pch of the photodiodes 30 and the display period are arranged to overlap each other. However, in the first detection period P2a, display need not be performed.

The control circuit 102 outputs a synchronization signal Vsync to the first scanning line drive circuit 15A, the second scanning line drive circuit 15B, the first decoder circuit 17A, and the second decoder circuit 17B. The first scanning line drive circuit 15A, the second scanning line drive circuit 15B, the first decoder circuit 17A, and the second decoder circuit 17B display one frame of an image or perform detection of photodiodes 30 corresponding to one frame based on the synchronization signal Vsync.

As described above, the clock signal CKV and the start control signals FSTV_RST and FSTV_PSEL are common to the display period P1 and the detection period P2. In other words, the control circuit 102 outputs the common clock signal CKV to the first shift register circuit 19A and the second shift register circuit 19B over the display period P1 and the detection period P2. The first decoder circuit 17A and the second decoder circuit 17B output the common start control signals FSTV_RST and FSTV_PSEL to the first shift register circuit 19A and the second shift register circuit 19B over the display period P1 and detection period P2. The start control signals FSTV_RST and FSTV_PSEL can also be represented as a display start control signal DSTV in the display period P1.

Figure 9:
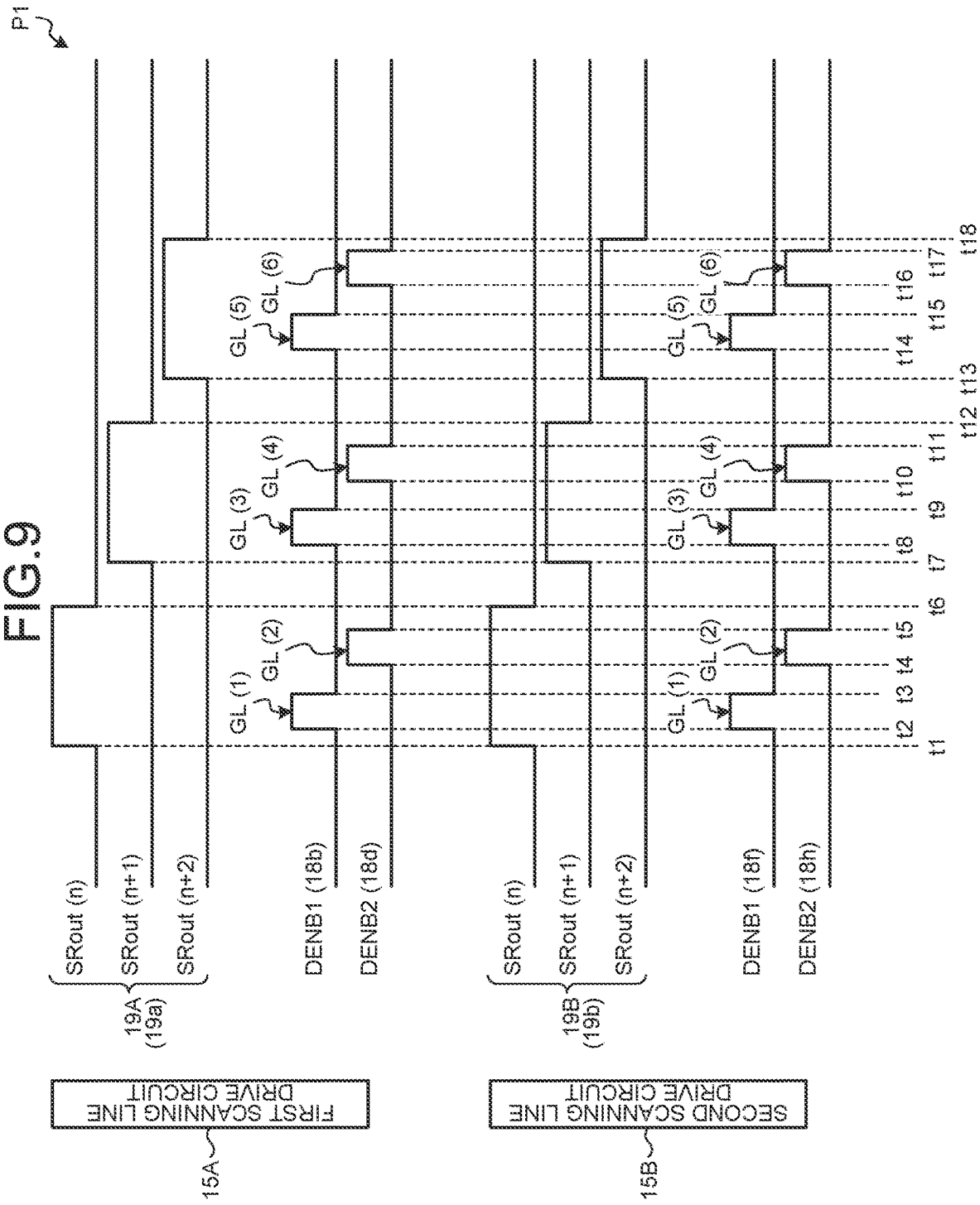
FIG. 9 is a timing waveform diagram illustrating an operation example of the first scanning line drive circuit and the second scanning line drive circuit in the display period.

FIG. 9 is a timing waveform diagram illustrating an operation example of the first scanning line drive circuit and the second scanning line drive circuit in the display period. As illustrated in FIG. 9, the first shift register circuit 19A sets an output signal SRout(n) to HIGH (high-level voltage) at time t1 based on the clock signal CKV and the start control signal FSTV_RST. The second shift register circuit 19B sets the output signal SRout(n) to HIGH (high-level voltage) at the time t1 based on the clock signal CKV and the start control signal FSTV_PSEL.

At time t2, the control circuit 102 sets the first display control signal DENB1 to HIGH (high-level voltage). The switching element 18*b* of the first switching circuit 18A couples the first shift register circuit 19A to the pixel scanning line GL(1) based on the output signal SRout(n) and the first display control signal DENB1, and supplies the gate drive signal VGL to the pixel scanning line GL(1). The switching element 18*f* of the second switching circuit 18B couples the second shift register circuit 19B to the pixel scanning line GL(1) based on the output signal SRout(n) and the first display control signal DENB1, and supplies the gate drive signal VGL to the pixel scanning line GL(1).

At time t3, the control circuit 102 sets the first display control signal DENB1 to LOW (low-level voltage). As a result, at time t3, the switching element 18*b* of the first switching circuit 18A decouples the first shift register circuit 19A and the pixel scanning line GL(1) from each other. At time t3, the switching element 18*f* of the second switching circuit 18B decouples the second shift register circuit 19B and the pixel scanning line GL(1) from each other.

At time t4, the control circuit 102 sets the second display control signal DENB2 to HIGH (high-level voltage). At time t4, the switching element 18*d* of the first switching circuit 18A couples the first shift register circuit 19A to the pixel scanning line GL(2), and supplies the gate drive signal VGL to the pixel scanning line GL(2). At time t4, the switching element 18*h* of the second switching circuit 18B couples the second shift register circuit 19B to the pixel scanning line GL(2), and supplies the gate drive signal VGL to the pixel scanning line GL(2).

At time t5, the control circuit 102 sets the second display control signal DENB2 to LOW (low-level voltage). As a result, at time t5, the switching element 18*d* of the first switching circuit 18A decouples the first shift register circuit 19A and the pixel scanning line GL(2) from each other. At time t5, the switching element 18*h* of the second switching circuit 18B decouples the second shift register circuit 19B and the pixel scanning line GL(2) from each other.

At time t6, the first shift register circuit 19A and the second shift register circuit 19B set the output signal SRout(n) to LOW (low-level voltage). At time t7, the first shift register circuit 19A and the second shift register circuit 19B set the output signal SRout(n+1) to HIGH (high-level voltage). After time t7, the pixel scanning lines GL(3), GL(4), GL(5), GL(6), . . . are sequentially selected for the respective sequential circuits 19*a*.

As described above, the control circuit 102 sequentially outputs the gate drive signals VGL to the pixels PX by the operations of the shift register circuit 19 and the switching circuit 18 in the display period P1. In the display period P1, the control circuit 102 sets the first detection control signal FENB1_RST, the second detection control signal FENB2_RST, the third detection control signal FENB1_PSEL, and the fourth detection control signal FENB2_PSEL to LOW (low-level voltage). As a result, the first scanning line drive circuit 15A and the second scanning line drive circuit 15B set the sensor control signals (reset control signal RST and read control signal RD), which are supplied to the reset control scanning line GLrst and the read control scanning line GLrd, to LOW (low-level voltage), and thus the photodiode 30 is non-driven.

Figure 10:
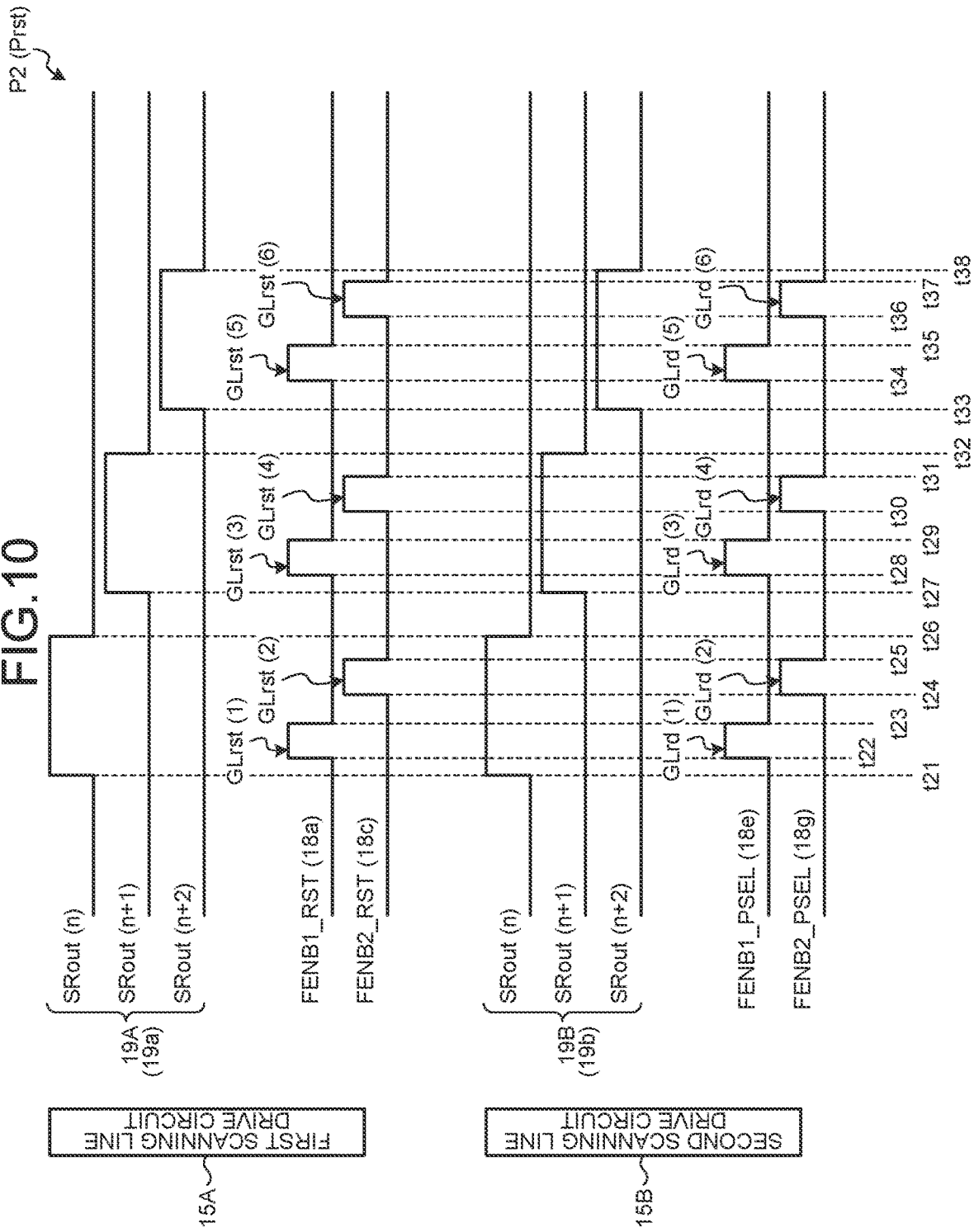
FIG. 10 is a timing waveform diagram illustrating an operation example of the first scanning line drive circuit and the second scanning line drive circuit in a reset period during the detection period.

FIG. 10 is a timing waveform diagram illustrating an operation example of the first scanning line drive circuit and the second scanning line drive circuit in a reset period during the detection period. As illustrated in FIG. 10, at time t21 in the reset period Prst of the detection period P2, the first shift register circuit 19A and the second shift register circuit 19B set the output signal SRout(n) to HIGH (high-level voltage) based on the clock signal CKV, and the start control signals FSTV_RST and FSTV_PSEL.

At time t22, the control circuit 102 sets the first detection control signal FENB1_RST to HIGH (high-level voltage). Based on these signals, the switching element 18*a* of the first switching circuit 18A couples the first shift register circuit 19A to the reset control scanning line GLrst(1), and supplies the reset control signal RST to the reset control scanning line GLrst(1). As a result, the reset period Prst of the photodiodes 30 coupled to the first row of the reset control scanning line GLrst(1) starts.

At time t22, the control circuit 102 sets the third detection control signal FENB1_PSEL to HIGH (high-level voltage). Based on these signals, the switching element 18*e* of the second switching circuit 18B couples the second shift register circuit 19B to the read control scanning line GLrd(1), and supplies the read control signal RD to the read control scanning line GLrd(1).

At time t23, the control circuit 102 sets the first detection control signal FENB1_RST to LOW (low-level voltage) and the third detection control signal FENB1_PSEL to LOW (low-level voltage). At time t23, the switching element 18*a* of the first switching circuit 18A decouples the first shift register circuit 19A and the reset control scanning line GLrst(1) from each other. The switching element 18*e* of the second switching circuit 18B decouples the second shift register circuit 19B and the read control scanning line GLrd(1) from each other. As a result, the reset period Prst of the photodiodes 30 coupled to the first row of the reset control scanning line GLrst(1) ends.

At time t24, the control circuit 102 sets the second detection control signal FENB2_RST to HIGH (high-level voltage). Based on these signals, the switching element 18*c* of the first switching circuit 18A couples the first shift register circuit 19A to the reset control scanning line GLrst(2), and supplies the reset control signal RST to the reset control scanning line GLrst(2). As a result, the reset period Prst of the photodiodes 30 coupled to the second row of the reset control scanning line GLrst(2) starts.

At time t24, the control circuit 102 sets the fourth detection control signal FENB2_PSEL to HIGH (high-level voltage). Based on these signals, the switching element 18*g* of the second switching circuit 18B couples the second shift register circuit 19B to the read control scanning line GLrd(2), and supplies the read control signal RD to the read control scanning line GLrd(2).

At time t25, the control circuit 102 sets the second detection control signal FENB2_RST to LOW (low-level voltage) and the fourth detection control signal FENB2_PSEL to LOW (low-level voltage). At time t25, the switching element 18*c* of the first switching circuit 18A decouples the first shift register circuit 19A and the reset control scanning line GLrst(2) from each other. The switching element 18*g* of the second switching circuit 18B decouples the second shift register circuit 19B and the read control scanning line GLrd(2) from each other. As a result, the reset period Prst of the photodiodes 30 coupled to the second row of the reset control scanning line GLrst(2) ends.

At time t26, the first shift register circuit 19A and the second shift register circuit 19B set the output signal SRout(n) to LOW (low-level voltage). At time t27, the first shift register circuit 19A and the second shift register circuit 19B set the output signal SRout(n+1) to HIGH (high-level voltage). After the time t27, in the same manner as the time t21 to time t26 described above, the reset control scanning lines GLrst(3), GLrst(4), GLrst(5), GLrst(6), . . . are sequentially selected by the operations of the first shift register circuit 19A and the first switching circuit 18A. The read control scanning lines GLrd(3), GLrd(4), GLrd(5), GLrd(6), . . . are sequentially selected by the operations of the second shift register circuit 19B and the second switching circuit 18B.

The exposure period Pch (refer to FIG. 8) starts at the timing when the reset period Prst of the photodiodes 30 in each row ends and ends at the timing when the read period Prd, described later, starts.

Figure 11:
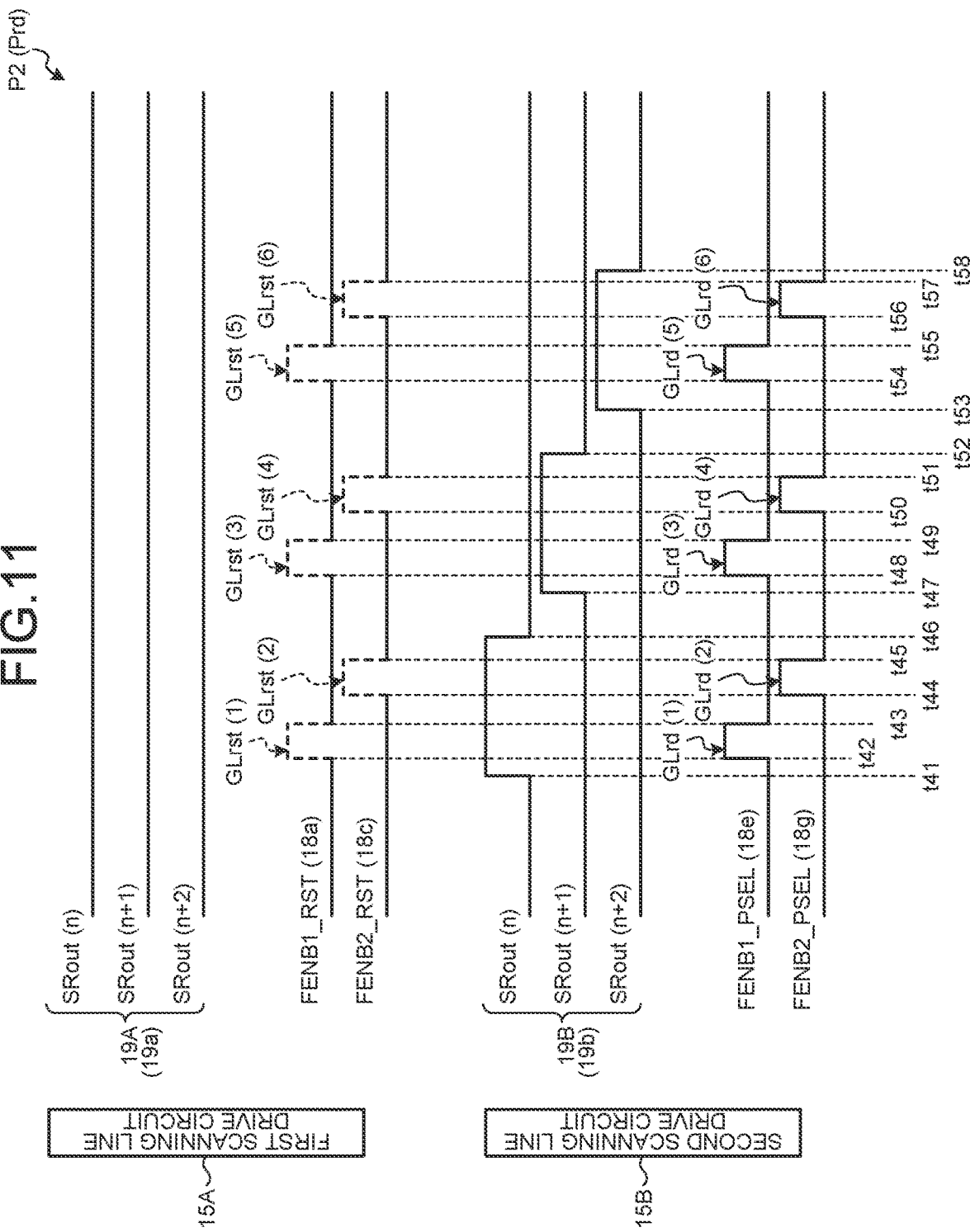
FIG. 11 is a timing waveform diagram illustrating an operation example of the first scanning line drive circuit and the second scanning line drive circuit in a read period during the detection period.

FIG. 11 is a timing waveform diagram illustrating an operation example of the first scanning line drive circuit and the second scanning line drive circuit in a read period during the detection period. As illustrated in FIG. 11, in the read period Prd of the detection period P2, the first shift register circuit 19A sets output signals SRout(n), SRout(n+1), and SRout(n+2) to LOW (low-level voltage). In the read period Prd, the switching elements 18a and 18c of the first switching circuit 18A decouple the first shift register circuit 19A and the reset control scanning line GLrst from each other, and the reset control signal RST is not supplied to the reset control scanning line GLrst.

In the read period Prd, the control circuit 102 sets the first detection control signal FENB1_RST and the second detection control signal FENB2_RST to LOW (low-level voltage). Alternatively, as illustrated by the dotted line in FIG. 11, the control circuit 102 may supply, to the first switching circuit 18A, the first detection control signal FENB1_RST and the second detection control signal FENB2_RST which are the same as those in the reset period Prst. Even in this case, the reset control signal RST is not supplied to the reset control scanning line GLrst because the output signal SRout of the first shift register circuit 19A is LOW (low-level voltage).

At time t41, the second shift register circuit 19B sets the output signal SRout(n) to HIGH (high-level voltage) based on the clock signal CKV and the start control signals FSTV_RST and FSTV_PSEL.

After time t42, the second shift register circuit 19B and the second switching circuit 18B perform the same operation as that in the reset period Prst described above, and sequentially supply the read control signals RD to the read control scanning lines GLrd(1), GLrd(2), GLrd(3), GLrd(4), GLrd(5), GLrd(6), . . . . As a result, the read transistor Mrd is turned on (into the conduction state) to end the exposure period Pch and start the read period Prd.

As described above, the control circuit 102 sequentially outputs the sensor control signals (reset control signal RST and read control signal RD) to the photodiodes 30 by the operations of the shift register circuit 19 (the first shift register circuit 19A and/or the second shift register circuit 19B) and the switching circuit 18 (the first switching circuit 18A and/or the second switching circuit 18B) in the detection period P2. As illustrated in FIGS. 8 to 11, in the display device 1 according to the present embodiment, the first shift register circuit 19A and the second shift register circuit 19B are common to the display period P1 and the detection period P2. The clock signal CKV and the start control signals FSTV_RST and FSTV_PSEL (refer to FIGS. 6 and 7) supplied to the shift register circuit 19 are also common over the display period P1 and detection period P2.

FIGS. 8 to 11 schematically illustrate the timing waveform diagrams, and the timing can be changed as appropriate. For example, the first detection period P2a and the second detection period P2b illustrated in FIG. 8 are illustrated in the same length, but are not limited to this. The first detection period P2a and the second detection period P2b may have different lengths.

As described above, the display device 1 according to the present embodiment includes: the pixels PX arranged in the display region AA; the photodiodes 30 provided in two or more of the pixels PX, respectively; the shift register circuit 19 that sequentially outputs the output signal SRout to the pixels PX and the photodiodes 30; the switching circuit 18 that switches the coupling between the shift register circuit 19 and the pixels PX, and the coupling between the shift register circuit 19 and the photodiodes 30; and the control circuit 102 that controls the display period P1 for display by the pixels PX and the detection period P2 for detection by the photodiodes 30 in a time division manner. The control circuit 102 sequentially outputs the gate drive signals VGL to the pixels PX by the operation of the shift register circuit 19 and the switching circuit 18 in the display period P1, and sequentially outputs the sensor control signals (reset control signal RST and read control signal RD) to the photodiodes 30 by the operation of the shift register circuit 19 and the switching circuit 18 in the detection period P2.

As a result, in the display device 1, the first scanning line drive circuit 15A and the second scanning line drive circuit 15B are common to the pixels PX and the photodiodes 30 and output the control signals (gate drive signal VGL, reset control signal RST, and read control signal RD). The clock signal CKV supplied from the control circuit 102 to the shift register circuit 19 and the start control signals FSTV_RST and FSTV_PSEL supplied from the decoder circuit 17 to the shift register circuit 19 are also common to the pixels PX and the photodiodes 30. This allows the display device 1 to be provided with the peripheral region GA having a narrower frame compared to the case where the drive circuit for scanning the pixels PX and the drive circuit for scanning the photodiodes 30 are provided separately.

Second Embodiment

Figure 12:
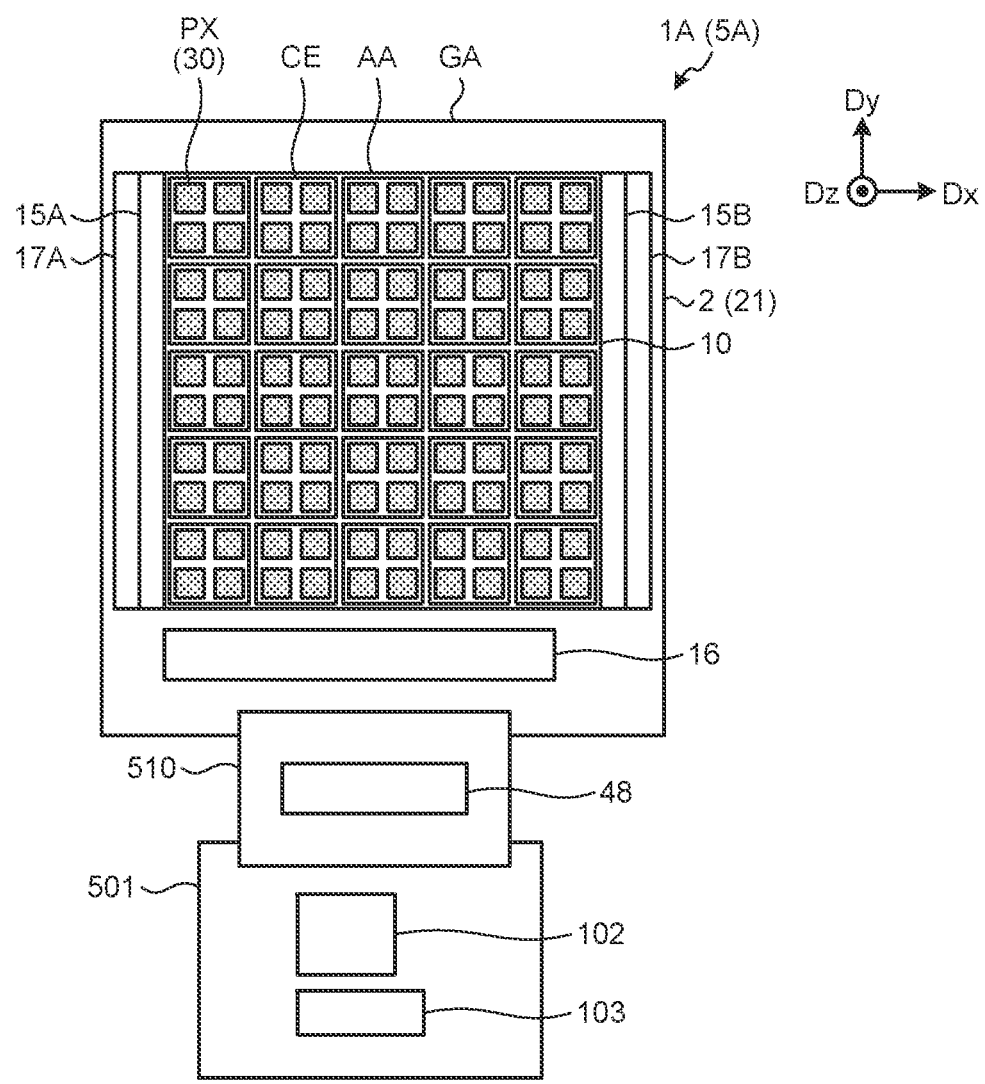
FIG. 12 is a plan view illustrating a display device according to a second embodiment.

FIG. 12 is a plan view illustrating the display device according to the second embodiment. In the following description, the same components as those described in the above-mentioned embodiments are denoted by the same reference numeral and duplicated explanations are omitted.

A display device 1A (display panel 5A) according to the second embodiment further includes a touch sensor that detects the contact with or proximity to the detection surface by the object to be detected FG. In other words, the display device 1A (display panel 5A) is a display device with a touch sensor and an optical sensor. The touch sensor performs touch detection, for example, by self-capacitance (also called self-system). Alternatively, the touch sensor may perform touch detection by, for example, mutual-capacitance (also called mutual-system).

As illustrated in FIG. 12, the display device 1A (display panel 5A) according to the second embodiment includes a plurality of detection electrodes CE arranged in a matrix having a row-column configuration in the display region AA. The detection electrodes CE are the detection electrodes of the touch sensor. In self-capacitive touch detection, the first scanning line drive circuit 15A, the second scanning line drive circuit 15B, the first decoder circuit 17A, and the second decoder circuit 17B simultaneously or time-divisionally scan the detection electrodes CE. The control circuit 102 supplies detection drive signals to the selected detection electrodes CE. The detection electrodes CE output, to the detection circuit 48, sensor output signals corresponding to the respective capacitance changes. The touch detection in the display region AA is performed based on the sensor output signals from the detection electrodes CE.

The detection electrodes CE may be provided on the array substrate 2 and may also serve as common electrodes for the pixels PX. In this case, the control circuit 102 supplies the display reference potential COM to the detection electrodes CE in a display period P1A (refer to FIG. 13). The touch sensor is not limited to a configuration of being integrated into the display device 1A and may be mounted on the display device 1A.

Figure 13:
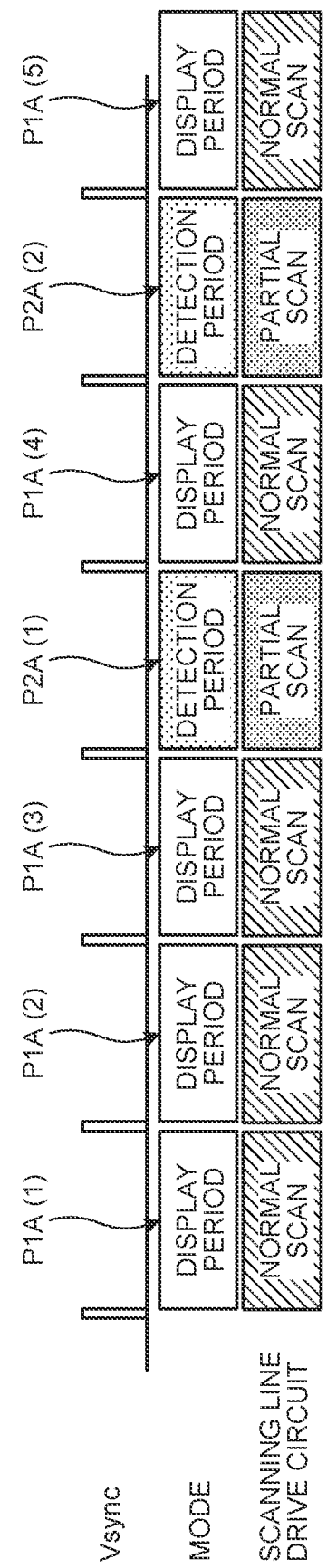
FIG. 13 is an explanatory diagram for explaining a display period and a detection period of the display device according to the second embodiment.

FIG. 13 is an explanatory diagram for explaining a display period and a detection period of the display device according to the second embodiment. As illustrated in FIG. 13, the display device 1A time-divisionally performs image display by the pixels PX and touch detection by the detection electrodes CE in the display period P1A. The touch detection in the display period P1A detects whether the object to be detected FG, such as the finger, is in contact with or proximity to the detection surface. For example, if an object to be detected FG is not detected in the touch detection of display period P1A(1), the control circuit 102 does not perform the detection period P2A with the photodiodes 30 and performs the next display period P1A(2). Here, in the display and touch detection in the display period P1A, the first scanning line drive circuit 15A and the second scanning line drive circuit 15B scan the entire display region AA (denoted as normal scan in FIG. 13).

If the object to be detected FG is detected in the touch detection in a display period P1A(3), the control circuit 102 moves to the detection period P2A(1) with the photodiodes 30. In the detection period P2A(1), based on the result of touch detection, the entire surface of the display region AA is not scanned, and only a part of the display region AA is scanned (denoted as partial scan in FIG. 13).

Figure 14:
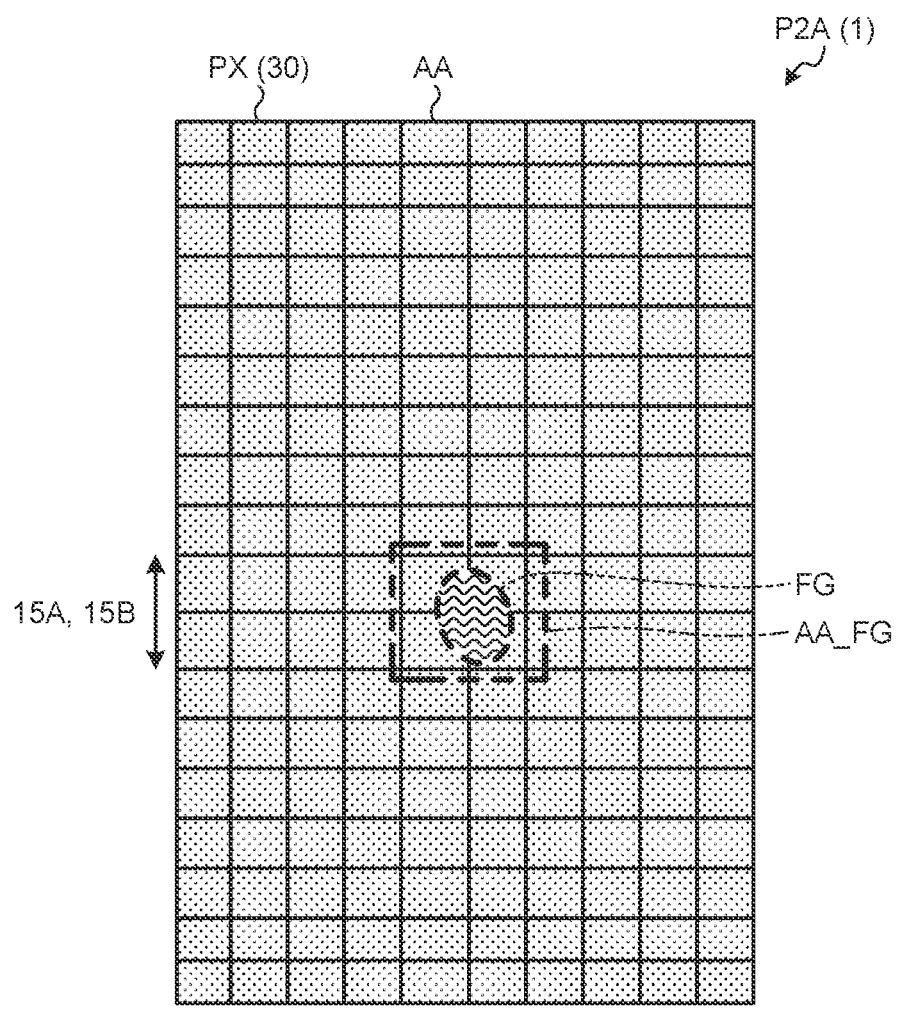
FIG. 14 is an explanatory diagram for explaining a partial scan in the detection period of the display device according to the second embodiment.

FIG. 14 is an explanatory diagram for explaining a partial scan in the detection period of the display device according to the second embodiment. As illustrated in FIG. 14, in the detection period P2A(1), the first scanning line drive circuit 15A and the second scanning line drive circuit 15B do not scan the entire surface of the display region AA, but only in a partial region AA_FG that includes the position where the object to be detected FG is detected. The position and size of the partial region AA_FG can be changed based on the information on the object to be detected FG that is detected in the display period P1A(3). Thus, the display device 1A may perform detection by the photodiodes 30 in the detection period P2A based on the touch detection results of the display period P1A. As a result, the area of the partial region AA_FG in the detection period P2A can be reduced, thus significantly reducing the time required for detecting the fingerprints or the like compared to the detection by the photodiodes 30 over the entire display region AA.

Figure 15:
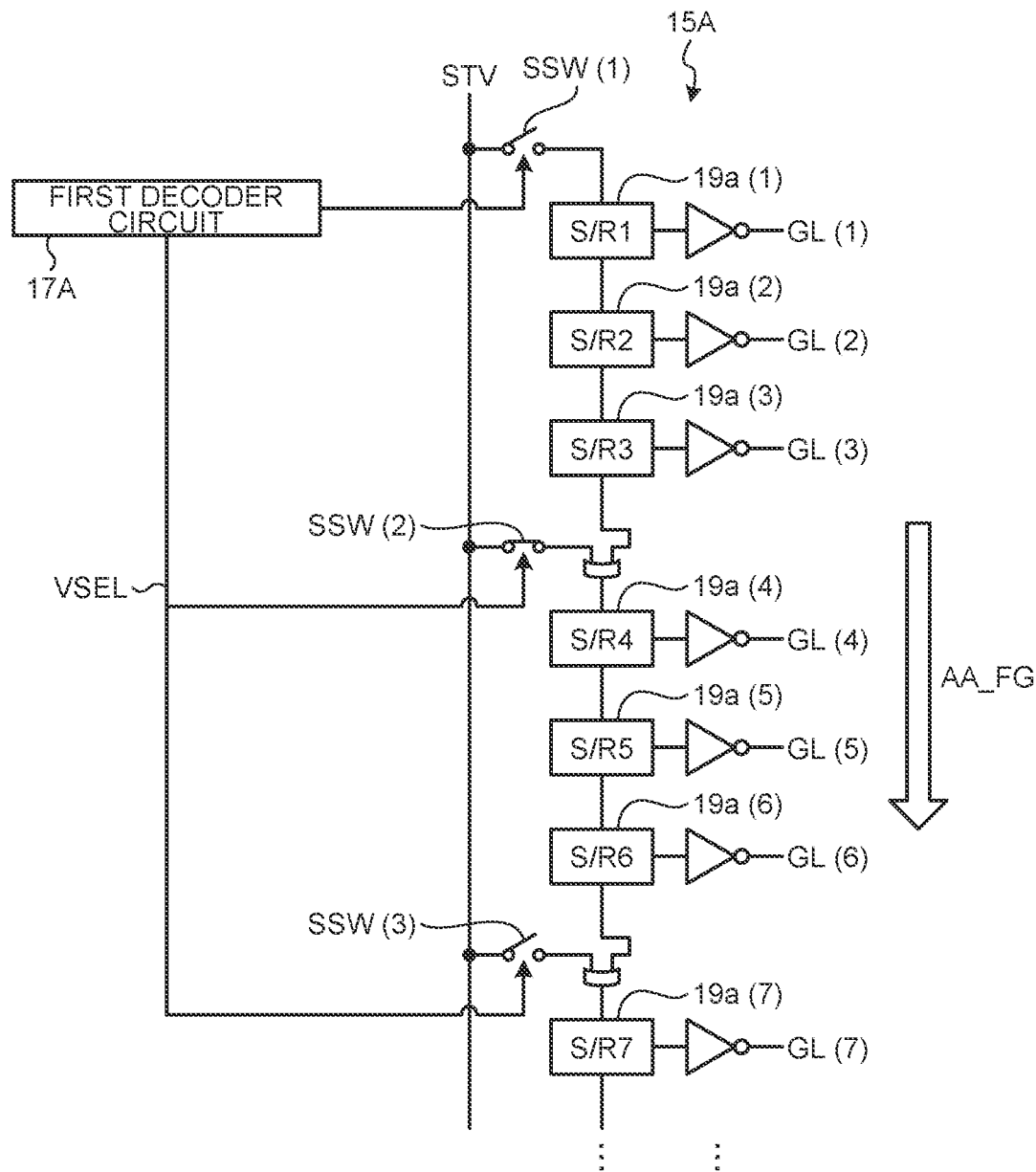
FIG. 15 is a circuit diagram schematically illustrating a first scanning line drive circuit according to the second embodiment.

FIG. 15 is a circuit diagram schematically illustrating a first scanning line drive circuit according to the second embodiment. As illustrated in FIG. 15, the first scanning line drive circuit 15A according to the second embodiment is provided with a selection switch SSW in units of the multiple sequential circuits 19a. One end of the selection switch SSW is coupled to the wiring for supplying the start control signal STV, and the other end of the selection switch SSW is coupled to the input side of each sequential circuit 19a.

In the example illustrated in FIG. 15, three sequential circuits 19a are disposed between a selection switch SSW(1) and a selection switch SSW(2), and between the selection switch SSW(2) and a selection switch SSW(3). The partial region AA_FG in the detection period P2A is set by an on-off control of the selection switch SSW.

The control circuit 102 determines a selection signal VSEL of the first decoder circuit 17A based on the detection signal from the touch sensor. The first decoder circuit 17A outputs the selection signal VSEL to the first shift register circuit 19A based on the control signal from the control circuit 102. In the detection period P2A, the control circuit 102 outputs the sensor control signals (reset control signal RST and read control signal RD) to the photodiodes 30 in the partial region AA_FG corresponding to the object to be detected FG by the operation of the first shift register circuit 19A and the first switching circuit 18A to perform partial scan of the partial region AA_FG.

In the example illustrated in FIG. 15, the selection signal VSEL from the first decoder circuit 17A turns off the selection switch SSW(1), turns on the selection switch SSW(2), and turns off the selection switch SSW(3). Therefore, the first scanning line drive circuit 15A does not output the output signal SRout from the sequential circuits 19a(1), 19a(2), and 19a(3), but outputs the output signal SRout from the sequential circuits 19a(4), 19a(5), and 19a(6) corresponding to the partial region AA_FG and performs scanning.

As described above, the display device 1A according to the second embodiment can perform detection by the photodiodes 30 in the partial region AA_FG set based on the detection result of the touch sensor by the selection signal VSEL from the first decoder circuit 17A.

FIG. 15 is only a schematic circuit diagram and can be changed as appropriate. For example, the number of sequential circuits 19a disposed between the selection switches SSW is not limited to three, and may be two or four or more. In FIG. 15, only the pixel scanning lines GL corresponding to the sequential circuits 19a is illustrated, and the reset control scanning line GLrst (refer to FIG. 6) is omitted. Although FIG. 15 illustrates the first scanning line drive circuit 15A, the same configuration as in FIG. 15 can be adopted for the second scanning line drive circuit 15B.

While the preferred embodiments have been described above, the present invention is not limited to the embodiments described above. The content disclosed in the embodiments is merely an example, and can be variously modified within the scope not departing from the gist of the present invention. Any modification appropriately made within the scope not departing from the gist of the present invention also naturally belongs to the technical scope of the present invention. At least one of various omissions, substitutions, and changes of the components can be made without departing from the gist of the embodiments and the modifications described above.

What is claimed is:

1. A display device comprising:
   a plurality of pixels arranged in a display region;
   a plurality of photodiodes provided in two or more of the pixels, respectively;
   a shift register circuit configured to sequentially output an output signal to the pixels and the photodiodes;
   a switching circuit configured to switch coupling between the shift register circuit and the pixels, and coupling between the shift register circuit and the photodiodes;
   a control circuit configured to control a display period for display by the pixels and a detection period for detection by the photodiodes in a time division manner;
   a reset transistor configured to output a reset potential to the photodiodes;
   a reset control scanning line coupled to a gate of the reset transistor;

a read transistor configured to switch coupling between a corresponding one of the photodiodes and a detection signal line;

a read control scanning line coupled to a gate of the read transistor; and a pixel scanning line coupled to one or more of the pixels, wherein the control circuit is configured to sequentially output a gate drive signal to the pixels by an operation of the shift register circuit and the switching circuit in the display period, and sequentially output a sensor control signal to the photodiodes by an operation of the shift register circuit and the switching circuit in the detection period, the shift register circuit includes a first shift register circuit and a second shift register circuit, the display region is disposed between the first shift register circuit and the second shift register circuit, the first shift register circuit is provided corresponding to the reset control scanning line and the pixel scanning line, and the second shift register circuit is provided corresponding to the read control scanning line and the pixel scanning line, the first shift register circuit disposed at a first side of the display region is coupled to the pixel scanning line that is coupled to the second shift register circuit disposed at a second side opposed to the first side of the display region, in the first shift register circuit, the pixel scanning line and the reset control scanning line is switched by the switching circuit of the first shift register circuit, in the second shift register circuit, the pixel scanning line and the read control scanning line is switched by the switching circuit of the second shift register circuit, the first shift register circuit is coupled to a plurality of the reset control scanning lines and a plurality of the pixel scanning lines, one of the pixel scanning lines of the first shift register circuit is selected by the switching circuit of the first shift register circuit, one of the reset control scanning lines of the first shift register circuit is selected by the switching circuit of the first shift register circuit, the second shift register circuit is coupled to a plurality of the read control scanning lines and a plurality of the pixel scanning lines, one of the pixel scanning lines coupled to the second shift register circuit is selected by the switching circuit of the second shift register circuit, and one of the read control scanning lines coupled to the second shift register circuit is selected by the switching circuit of the second shift register circuit.

2. The display device according to claim 1, further comprising a decoder circuit configured to output a selection signal to the shift register circuit, wherein the control circuit is configured to output the sensor control signal to two or more of the photodiodes corresponding to the selection signal from the decoder circuit by the operation of the shift register circuit and the switching circuit in the detection period.

3. The display device according to claim 2, further comprising a capacitive touch sensor, wherein the control circuit is configured to determine the selection signal of the decoder circuit based on a detection signal from the touch sensor.

4. The display device according to claim 1, wherein each of the pixels includes a first pixel, a second pixel, and a third pixel arranged in the display region, and each of the photodiodes is provided in the third pixel of a corresponding one of the pixels.

5. The display device according to claim 4, wherein the third pixel displays blue.

6. The display device according to claim 1, wherein the reset control scanning line and the read control scanning line extend along an extending direction of the pixel scanning line, and the reset control scanning line and the read control scanning line are arranged alternately in a direction orthogonal to the extending direction of the pixel scanning line.

* * * * *